(12) United States Patent
Nozawa

(10) Patent No.: US 7,122,954 B2
(45) Date of Patent: Oct. 17, 2006

(54) ELECTRO-OPTICAL DEVICE, METHOD OF MANUFACTURING THE SAME, AND ELECTRONIC APPARATUS

(75) Inventor: Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 168 days.

(21) Appl. No.: 10/643,918

(22) Filed: Aug. 20, 2003

(65) Prior Publication Data
US 2004/0056588 A1 Mar. 25, 2004

(30) Foreign Application Priority Data
Aug. 30, 2002 (JP) ............................. 2002-253489

(51) Int. Cl.
*H05B 33/08* (2006.01)
*H05B 33/06* (2006.01)
(52) U.S. Cl. .................. 313/500; 313/505; 313/506
(58) Field of Classification Search ................ 313/504, 313/505, 506, 512; 315/169.3; 349/125
See application file for complete search history.

(56) References Cited
U.S. PATENT DOCUMENTS

| 5,585,307 | A |   | 12/1996 | Yoo |  |
|---|---|---|---|---|---|
| 5,821,003 | A | * | 10/1998 | Uemura et al. | 428/690 |
| 6,075,317 | A | * | 6/2000 | Keyser et al. | 313/505 |
| 6,147,451 | A | * | 11/2000 | Shibata et al. | 313/506 |
| 6,376,380 | B1 |   | 4/2002 | Tang et al. |  |
| 6,590,346 | B1 | * | 7/2003 | Hadley et al. | 315/169.3 |
| 6,590,349 | B1 | * | 7/2003 | Moindron | 315/240 |
| 6,597,121 | B1 | * | 7/2003 | Imura | 313/500 |
| 6,723,576 | B1 |   | 4/2004 | Nozawa et al. | 438/30 |
| 6,836,069 | B1 | * | 12/2004 | Iga | 313/506 |
| 6,844,673 | B1 | * | 1/2005 | Bernkopf | 313/506 |
| 2002/0158577 | A1 | * | 10/2002 | Shimoda et al. | 313/506 |

FOREIGN PATENT DOCUMENTS

| CN | 488094 |   | 5/2002 |
| JP | 59-104170 |   | 6/1984 |
| JP | 06-216158 |   | 8/1994 |
| JP | 2001166311 A | * | 6/2001 |
| JP | 2003-015548 |   | 1/2003 |
| JP | 2003-108029 |   | 4/2003 |
| TW | 358227 |   | 5/1985 |

* cited by examiner

*Primary Examiner*—Mariceli Santiago
(74) *Attorney, Agent, or Firm*—Oliff & Berridge, PLC

(57) ABSTRACT

The present invention provides an electro-optical device and a method of manufacturing the same capable of suppressing an influence due to an irregularity of a switching element or a wiring line on a functional element. An organic EL apparatus can include on a substrate an organic EL device, a wiring for supplying a power to the organic EL device, and a switching element. An insulating layer can be formed on the substrate, and a concave part is formed in the insulating layer to dispose the switching element.

8 Claims, 10 Drawing Sheets

ELECTRO-OPTICAL DEVICE, METHOD OF MANUFACTURING THE SAME, AND ELECTRONIC APPARATUS

BACKGROUND OF THE INVENTION

1. Field of Invention

The present invention relates to an electro-optical device having functional elements on a substrate, a method of manufacturing the same, and an electronic apparatus.

2. Description of Related Art

An organic electroluminescent display device (organic EL device) having organic electroluminescent elements corresponding to each pixel has excellent display capabilities, such as high brightness, spontaneous luminance, DC low voltage driving acceptability, high speed response, luminescence by a solid organic film, and the like. It is possible for the display device to be thinner, lighter and to have low power consumption, so thus the organic EL device is expected to be a display device placed after a liquid crystal display device in the future. In an organic EL device, an organic EL element controls power being supplied to electrodes by using a switching element such as a thin film transistor (TFT).

SUMMARY OF THE INVENTION

However, a conventional electro-optical device having the above-described organic EL device and the switching element has following problems that will be described hereinafter.

An electro-optical device can be formed by stacking a plurality of material layers, and more specifically, is formed by stacking a switching element and a functional element (organic EL element) on a substrate. Herein, if an irregularity difference of about 1 µm generates on a top face of the switching element, when a functional element is disposed above a switching element, an irregularity of the switching element affects the functional element disposed thereon, thereby resulting in deterioration of function of the functional element. In other words, the irregularity of the switching element causes the functional element (organic EL element) to also have an irregularity so that there is an influence on a display quality, such as deteriorations of luminous efficiency or brightness. Specifically, if an irregularity can be formed in an electrode of an organic EL element, a light-emitting layer or a hole-injecting layer, luminous efficiency or brightness deteriorates remarkably.

However, it is considered to suppress an influence of an irregularity of the switching element on the functional element by deviating the position of the switching element from that of the functional element in surface direction of the substrate, in this regard liberties of design may be reduced.

A technology of burying a TFT in a glass substrate is disclosed in Japanese Unexamined Patent Application Publication No. 59-104170. In this technology, while it is effective to accomplish miniaturization of an apparatus as well as reduction of an irregularity, processability becomes lower and a hardness of the glass substrate by itself also reduces.

This invention was made in consideration of these problems, an object of the present invention is to provide an electro-optical device, a method of manufacturing the same, and an electronic apparatus equipped with the electro-optical device capable of suppressing an influence of irregularities of a switching element and a wiring line below a functional element even though the functional element including an organic EL element is disposed above the switching element and wiring line connected thereto.

To solve the above-described problems, an electro-optical device of the present invention can provide an electro-optical device having functional elements and power connection parts for supplying power to the functional elements on a substrate. The electro-optical device can include concave parts formed in a material layer provided on the substrate to dispose the power connection parts therein. According to the present invention, by forming concave parts in a material layer formed on a substrate and disposing power connection parts in the concave parts, top faces of the power connection parts and the material layer can be flattened in good processability while holding a hardness of the substrate. Thus, even though functional elements are formed above the power connection parts, it is possible to avoid a problem in that the functional elements have irregularities.

In this case, the power connection parts can include switching elements. A configuration that the switching elements are thin film transistors is also adopted. Thereby, top faces of thin film transistors (TFTs) as switching elements and a material layer can be flattened. The switching element is not limited to the TFT, thus MIM (Metal Insulator Metal) is also acceptable.

Moreover, in this case, the power connection part can include wiring lines. That is, wiring lines such as feeders connected to thin film transistors can be disposed in the concave parts to accomplish the flatness of top face of a material layer.

In the electro-optical device according to the present invention, a configuration that the concave parts are formed in an insulating layer provided on the substrate is adopted. Thereby, the power connection parts are buried in the insulating layer. Also, power can be supplied under a desired performance without an electrical influence of environment.

In the electro-optical device according to the present invention, there is adopted a configuration that the concave parts are formed in a tapered shape being narrower toward the substrate. Thereby, when a liquid material is ejected into the concave part by using a liquid droplet ejecting method, liquid droplets of the ejected liquid material are smoothly disposed below the concave part along the inner wall of the concave part in a tapered shape without diffusion in horizontal direction. Since an edge portion of the concave part is formed at an obtuse angle, when other material layer is formed above the concave part to which a power connection part is disposed by using a method such as a spin coating method, better flatness can be accomplished.

In the electro-optical device according to the present invention, there can be adopted a configuration that a top face of the material layer in which the concave parts are formed is substantially continuous with top faces of the power connection parts. As a result, better flatness can be accomplished.

In the electro-optical device according to the present invention, there can be adopted a configuration that at least a portion of each of the functional elements is overlapped with each of the power connection parts. That is, though a position of the functional element is freely set dispense with the power connection part, since performance of the functional element does not reduce, the liberty of design relating to disposition of the power connection part increases. In addition, since the functional element can be overlapped with the power connection part to make the functional element have a larger area, when the functional element is a luminescent element, a luminescent area can be larger.

In the electro-optical device according to the present invention, there can be adopted a configuration that the functional elements are organic electroluminescent elements. As a result, an organic electroluminescent element capable of obtaining a high brightness with preferable luminous efficiency can be provided.

The present invention can provide a method of manufacturing an electro-optical device including functional elements and power connection parts for supplying power to the functional elements provided on a substrate. The method can include the steps of forming in advance concave parts in a predetermined material layer provided on the substrate, disposing the power connection parts in the concave parts, and disposing the functional elements. According to the present invention, by forming the concave parts in the material layer formed on the substrate and disposing the power connection parts in the concave parts, the top faces of the power connection part and the material layer can be flattened. Thus, when the functional elements are formed in following process, since there is no irregularity in the functional elements, the functional element can do a desired operation.

In this case, the power connection parts include switching elements. A configuration that the switching elements are thin film transistors is also adopted. Thereby, top faces of thin film transistors (TFTs) as switching elements and a material layer can be flattened. The switching element is not limited to the TFT, thus MIM (Metal Insulator Metal) is also acceptable. Moreover, in this case, the power connection part includes wiring lines. That is, wiring lines such as feeders connected to thin film transistors can be disposed in the concave parts to accomplish the flatness of top face of a material layer.

In the method of manufacturing an electro-optical device according to the present invention, there can be adopted a configuration that the concave parts are formed in an insulating layer provided on the substrate and the power connection parts are disposed in the concave parts. As a result, the power connection part is disposed to be buried in the insulating layer without an electrical influence due to environment.

In the method of manufacturing an electro-optical device according to the present invention, there can be adopted a configuration that the concave parts are formed in a tapered shape being narrower toward the substrate. Thereby, when a liquid material is ejected into the concave part by using a liquid droplet ejecting method, liquid droplets of the ejected liquid material are smoothly disposed below the concave part along the inner wall of the concave part in a tapered shape without diffusion in horizontal direction. Since an edge portion of the concave part is formed at an obtuse angle, when other material layer is formed above the concave part to which a power connection part is disposed by using a method such as a spin coating method, better flatness can be accomplished.

In the method of manufacturing an electro-optical device according to the present invention, there can be adopted a configuration that a depth of the concave parts is set in advance so that a top face of the material layer in which the concave parts are formed is substantially continuous with top faces of the power connection parts disposed in the concave parts, and the concave parts are formed on the basis of the setting. As a result, better flatness can be obtained.

The present invention can provide a method of manufacturing an electro-optical device including functional elements and power connection parts for supplying power to the functional elements provided on a substrate. The method can include the steps of forming the power connection parts on the substrate or on a supporting layer provided on the substrate, disposing a predetermined material layer around the power connection parts so that a top face of the material is substantially continuous with top faces of the power connection parts, and disposing the functional elements.

That is, it is preferable that the power connection parts be formed on the substrate or the supporting layer and then the material layer is disposed around the power connection parts to accomplish flatness.

In the method of manufacturing an electro-optical device according to the present invention, there is adopted a configuration that at least one of the functional elements and the power connection parts is disposed by using a liquid droplet ejecting method. The functional elements and the power connection parts are formed by using a liquid droplet ejecting method. As a result, since it is possible to meet a small quantity and multi sort production, good efficient manufacture can be obtained.

An electronic apparatus of the present invention is equipped with the above-described electro-optical device. Thereby, an electronic apparatus having an excellent characteristic is provided.

Herein, a liquid droplet ejecting device used for the above-described liquid droplet ejecting method can include an inkjet apparatus having an inkjet head (liquid droplet ejecting head); The inkjet head of the inkjet apparatus can eject constantly a liquid material by an inkjet method. For example, constant liquid material of 1 to 300 ng per one dot can be intermittently ejected. Also, a dispenser apparatus can be used as a liquid droplet ejecting device.

As a liquid droplet ejecting method of the liquid droplet ejecting device, it is desired that any one of a piezo-ejecting method of ejecting liquid droplets of liquid material corresponding to variation in volume of a piezoelectric element and a method of ejecting liquid material by rapidly generating a steam due to heating is used.

The liquid material is a medium having a viscosity where the medium can be ejected (dropped) from a nozzle of an ejecting head of a liquid droplet ejecting device, whether the liquid material is water based or oil based. A material having fluidity (viscosity) capable of being ejected from a nozzle, etc. is enough for the liquid material. Though a solid material is mixed in the liquid material, it is desired that the liquid material has fluidity as a whole. A material included in the liquid material may be dissolved by heating at a melting point or more than, agitated in a solvent as a fine particle, or added a functional material such as a dye or a pigment besides a solvent thereto. Further, the substrate may be a curved substrate besides the flat substrate. Furthermore, the hardness of the pattern-forming surface may not by hard, and the surface may be a surface of material, such as film, paper or rubber in addition to glass, plastic, or metal, which has flexibility.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
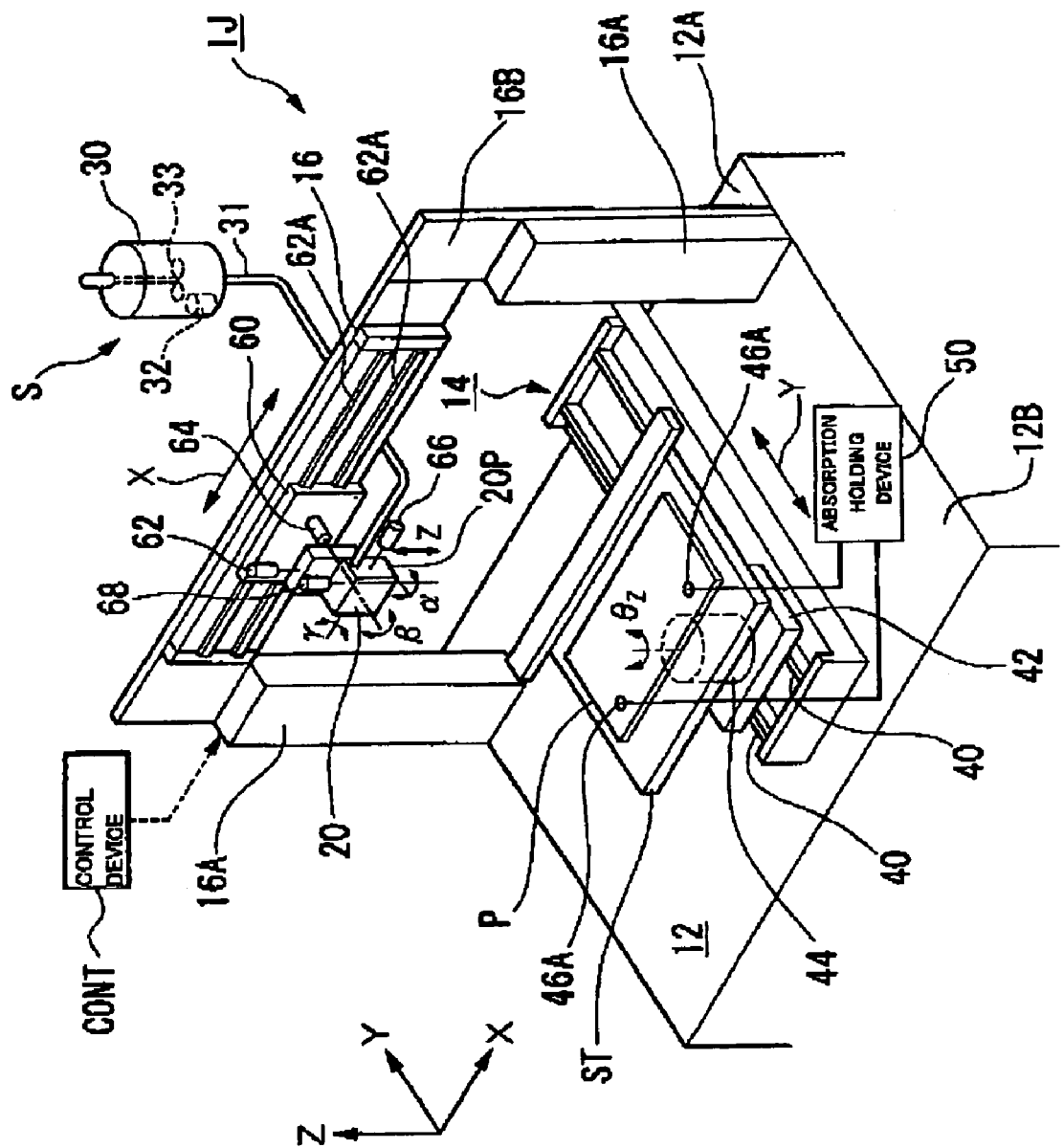
FIG. 1 is a schematic perspective view illustrating an embodiment of a liquid droplet ejecting device used for a method of manufacturing an electro-optical device of the present invention.
Figure 2:
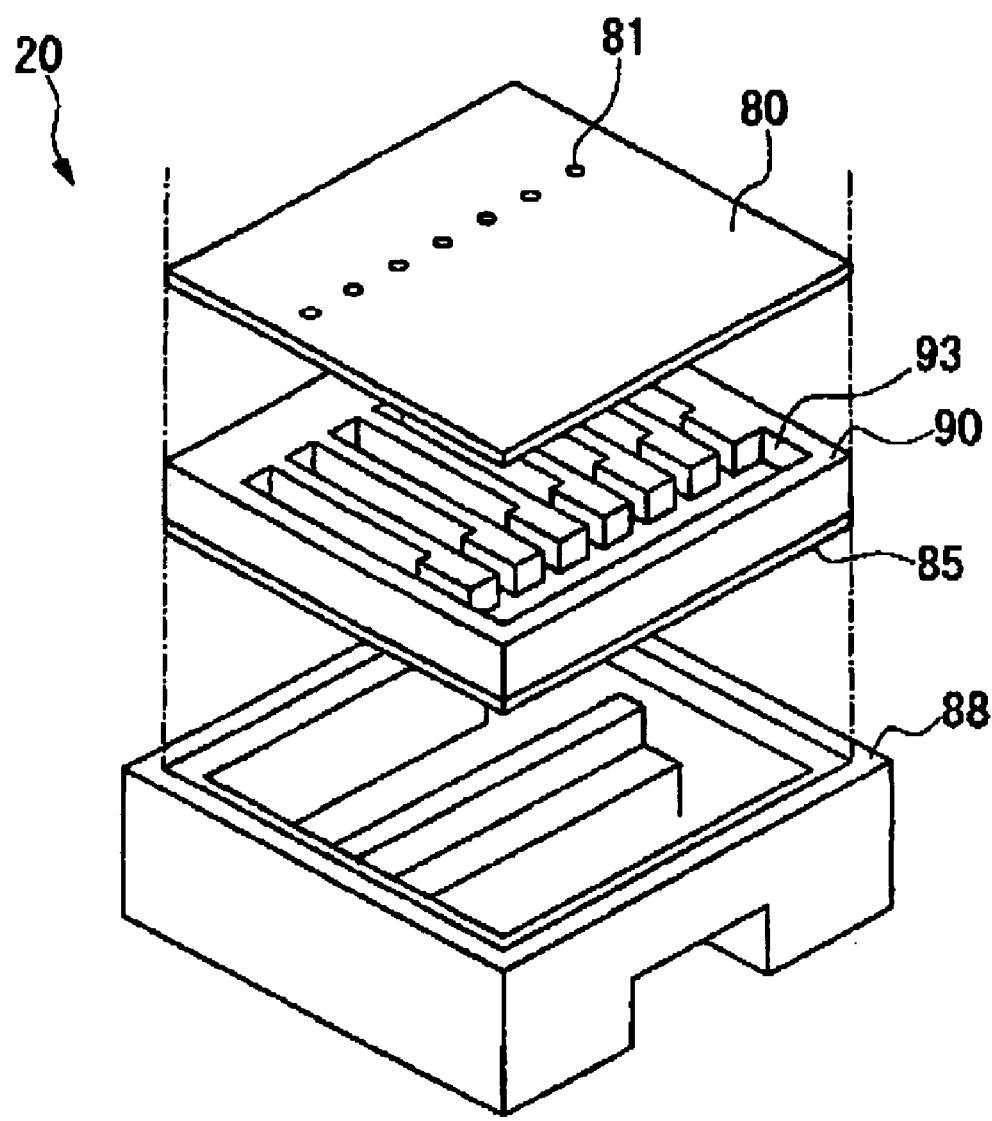
FIG. 2 is a diagram for explanation of a liquid droplet ejecting head.
Figure 3:
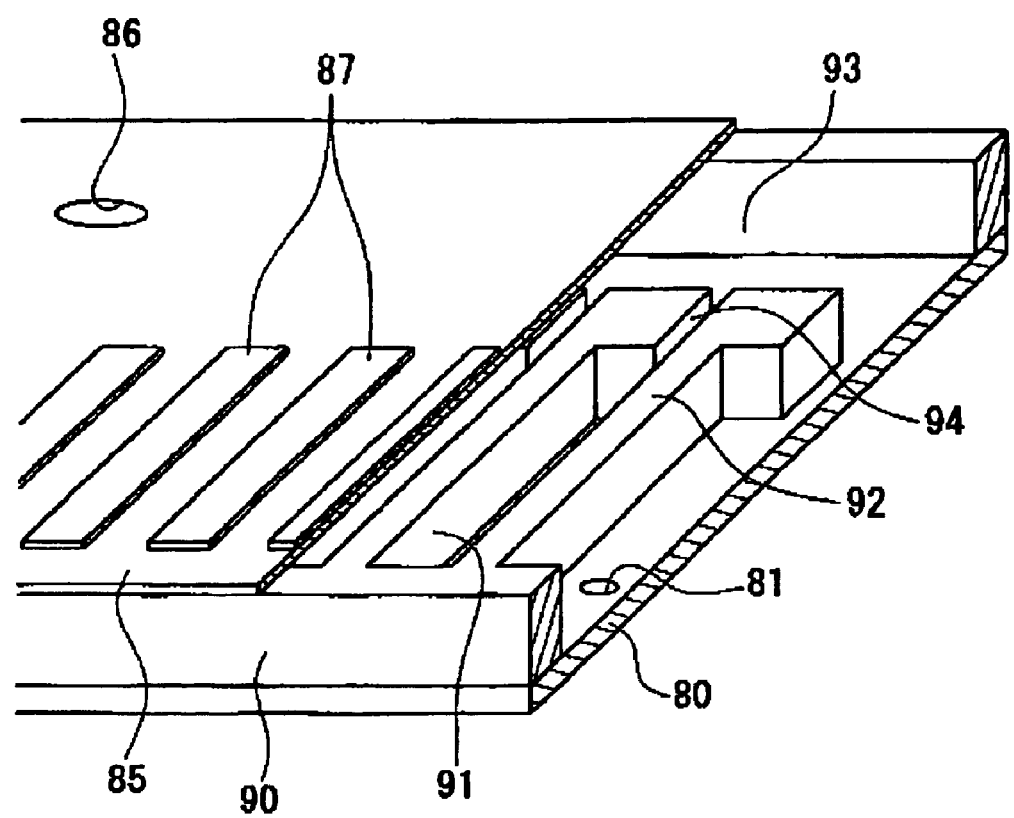
FIG. 3 is a diagram for explanation of a liquid droplet ejecting head.

Hereinafter, an electro-optical device and a method of manufacturing the same of the present invention will be described with reference to Figures. FIG. 1 is a schematic perspective view illustrating a liquid droplet ejecting device used for manufacturing an electro-optical device of the present invention. Also, FIGS. 2 and 3 are diagrams for explanation of a liquid droplet ejecting head.

In FIG. 1, an exemplary liquid droplet ejecting device IJ is a film forming device capable of disposing liquid droplets (ink droplets) on a surface (a predetermined surface) of a substrate P, and includes a base 12, a stage (stage device) ST formed on the base 12 for supporting the substrate P, a first moving device 14 interposed between the base 12 and the stage ST for supporting the stage ST in a movable state, a liquid droplet ejecting head 20 capable of ejecting constantly liquid droplets including an electro-optical device formation material to the substrate P supported by the stage ST, and a second moving device 16 for supporting the liquid droplet ejecting head 20 in a movable state. Operations of the liquid droplet ejecting device IJ including an ejecting operation of liquid droplets of the liquid droplet ejecting head 20 or moving operations of the first moving device 14 and the second moving device 16 are controlled by a control device CONT.

The first moving apparatus 14 is formed on the base 12, and is positioned along the Y-axis direction. The second moving apparatus 16 is mounted vertical to the base 12 by using pillars 16A, 16A and mounted in a rear 12A of the base 12. An X-axis direction of the second moving device 16 is vertical to a Y-axis direction of the first moving device 14. Herein, the Y-axis direction is a direction along a front 12B and the rear 12A of the base. On the contrary, the X-axis direction is a direction along left and right of the base 12, and two directions are planar to each other. Also, a Z-axis direction is a direction vertical to the X-axis and Y-axis directions.

The first moving device 14 is configured by, for example, a linear motor, and includes guide rails 40, 40, and a slide 42 formed to be capable of moving along the guide rails 40. The slide 42 of the first moving device 14 of a linear motor type can be positioned by moving along the guide rails 40 in the Y-axis direction.

The slide 42 also includes a motor 44 for a Z-axis rotation (θZ). The motor 44 is, for example, a direct drive motor, and a rotor of the motor 44 is fixed to the stage ST. As a result, when a power is applied to the motor, the rotor and the stage ST rotate along a θZ direction and the stage ST is indexed (calculate the rotation). That is, the first moving device 14 is capable of moving the stage ST in the Y-axis direction as well as in the θZ direction.

The stage ST holds the substrate P and positions in a predetermined position. The stage ST also includes an absorption holding device 50. Thus, by operation of the absorption holding device 50, the stage ST absorbs and holds the substrate P through a hole 46A of the stage ST.

The second moving device 16 is configured by a linear motor, and can include a column 16B fixed to the pillars 16A, 16A, a guide rail 62A supported by the column 16B, and a slide 60 capable of moving along the guide rail 62A in the X-axis direction. The slide 60 can be positioned by moving along the guide rail 62A in the X-axis direction, and a liquid droplet ejecting head 20 is mounted on the slide 60.

The liquid droplet ejecting head 20 includes motors 62, 64, 66, 68 as a fluctuating position determination device. In operation of the motor 62, the position of the liquid droplet ejecting head 20 can be determined by moving up and down along the Z-axis direction. This Z-axis direction is a direction (up and down) vertical to each of the X and Y-axes directions. In operation of the motor 64, the position of the liquid droplet ejecting head 20 can be determined by fluctuating along a β direction of Y-axis rotation. In operation of the motor 66, the position of the liquid droplet ejecting head 20 can be determined by fluctuating along a γ direction of X-axis rotation. In operation of the motor 68, the position of the liquid droplet ejecting head 20 can be determined by fluctuating along a α direction of Z-axis rotation. That is, the second moving device 16 supports the liquid droplet ejecting head 20 to be capable of moving in the X and Y-axes directions, but also supports the liquid droplet ejecting head 20 to be capable of moving in the θX, θY, and θZ directions.

As described above, in the slide 60, the liquid droplet ejecting head 20 of FIG. 1 can be positioned by linear moving in the Z-axis direction, and positioned by fluctuating along the α, β, γ directions, and an ejecting face 20P of the liquid droplet ejecting head 20 can accurately control a position or a posture thereof with respect to the substrate P facing the stage ST. A plurality of nozzles for ejecting liquid droplets is also disposed on the ejecting face 20P of the liquid droplet ejecting head 20.

FIG. 2 is an exploded perspective view illustrating a liquid droplet ejecting head 20. As shown in FIG. 2, the liquid droplet ejecting head 20 includes a nozzle plate 80 having nozzles 81, a pressure room substrate 90 having a vibrating plate 85, and a case 88 for supporting the nozzle plate 80 and the vibrating plate 85 being inserted therein. A configuration of a main part of the liquid droplet ejecting head 20 has a configuration that the pressure room substrate 90 is interposed between the nozzle plate 80 and the vibrating plate 85, as shown in a partial cutaway perspective view of FIG. 3. The nozzle 81 is formed in a position corresponding to a cavity (pressure room) 91 when being jointed to the pressure room substrate 90. A plurality of cavities 91 is formed in the pressure room substrate 90 by etching a silicon single crystal substrate, each being capable of functioning as a pressure room. The cavities 91 are separated from each other by partitioned 92. Each cavity 91 is connected to the reservoir 93 of a common flow way through a supplying port 94. The vibrating plate 85 is made of a thermal oxidation film and so on. A tank port 86 is formed in the vibrating plate 85 so that any liquid droplets can be supplied thereto through a pipe (flow way) 31 from a tank. Piezoelectric elements 87 are formed in positions corresponding to cavities 91 of the vibrating plate 85. The piezoelectric element 87 has a configuration that a piezoelectric ceramic crystal such as a piezoelectric element is disposed between upper and lower electrodes (not shown). The piezoelectric elements 87 are formed so that volume thereof can vary depending on an ejecting signal supplied from the control device CONT.

To eject liquid droplets from the liquid droplet ejecting head 20, first, the control device CONT supplies an ejecting signal for ejecting liquid droplets to the liquid droplet ejecting head 20. Liquid droplets flow into the cavities 91 of the liquid droplets ejecting head 20. In a liquid droplet ejecting head 20 to which the ejecting signal is supplied, volume of the piezoelectric element 87 varies due to voltage applied to between the upper and the lower electrodes. The variation in volume transforms the vibrating plate 85, and thus the volumes of the cavities 91 are varied. As a result, liquid droplets are ejected from nozzle holes 211 of the cavities 91. Liquid materials reduced due to ejection are newly supplied from a tank 30 that will be described below to the cavities 91 where liquid droplets are ejected.

Though the above-described liquid droplet ejecting head has a configuration that the liquid droplets are ejected by varying volume of a piezoelectric element, it is also desired that liquid materials are heated by an exothermic body and the head ejects liquid droplets in accordance with the thermal expansion.

Returning to FIG. 1, liquid material formed on the substrate P is produced by a liquid material regulating device S. The liquid material regulating device S includes a tank 30 capable of accommodating liquid material, a temperature adjusting device 32 mounted in the tank 30 so as to adjust a temperature of the liquid material accommodated by the tank 30, and an agitating device 33 for agitating the liquid material accommodated by the tank 30. The temperature adjusting device 32 is configured by a heater 32, and adjusts the temperature of the liquid material in the tank 30 to a predetermined level. The temperature adjusting device 32 is controlled by the control device CONT, and temperature of the liquid material in the tank 30 is adjusted by the temperature adjusting device 32 so that viscosity of the liquid material can be adjusted to a desired level.

The tank 30 is connected to the liquid droplet ejecting head 20 through a pipe (flow way) 31, and liquid droplets of liquid material ejected from the liquid droplet ejecting head 20 are supplied through the pipe 31 from the tank 30. A liquid material flowing the pipe 31 is controlled to a desired temperature by a pipe temperature adjusting device (not shown) so that viscosity thereof can be adjusted. Moreover, a temperature of liquid droplet ejected from the liquid droplet ejecting head 20 is controlled by a temperature adjusting device (not shown) included in the liquid droplet ejecting head 20 so that viscosity thereof can be adjusted to a desired level.

Also, though only one liquid droplet ejecting head 20 and one liquid material regulating device S are showed in FIG. 1, respectively, a plurality of liquid droplet ejecting heads 20 and a plurality of liquid material regulating devices S are formed in the liquid droplet ejecting device IJ, and liquid droplets of different or equal kinds of liquid material may be ejected from each of the plurality of the liquid droplet ejecting heads 20. Thus, a first liquid material is ejected to the substrate P from a first liquid droplet ejecting head of the plurality of the liquid droplet ejecting heads 20, and then, is baked and dried. Next, a second liquid material is ejected to the substrate P from a second liquid droplet ejecting head, and then, is baked and dried. Processes for other liquid materials are executed by using the plurality of the liquid droplet ejecting heads in the same manner, so that a plurality of material layers are deposited on the substrate P to form a multi-layer pattern.

Next, a method for manufacturing an electro-optical device using the above-described liquid droplet ejecting device IJ will be described. Hereinafter, as an example, a method of manufacturing an organic electroluminescent element (an organic EL element) as an electro-optical device which will exemplarily be described. The order or the configuration of liquid material will be described below is only an example, but does not limit thereto.

Figure 4:
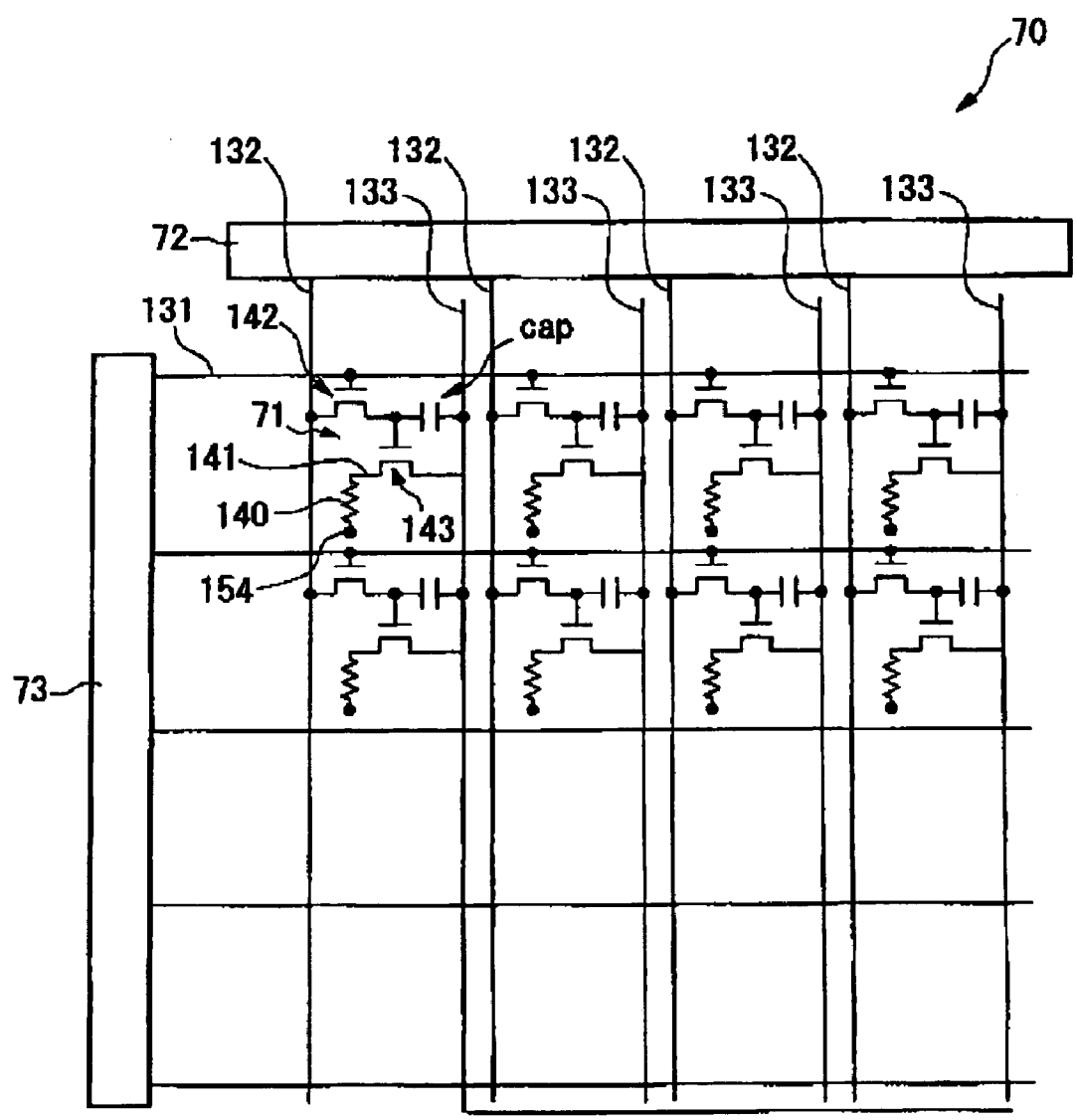
FIG. 4 is a circuit diagram of an organic EL device as an electro-optical device.
Figure 5:
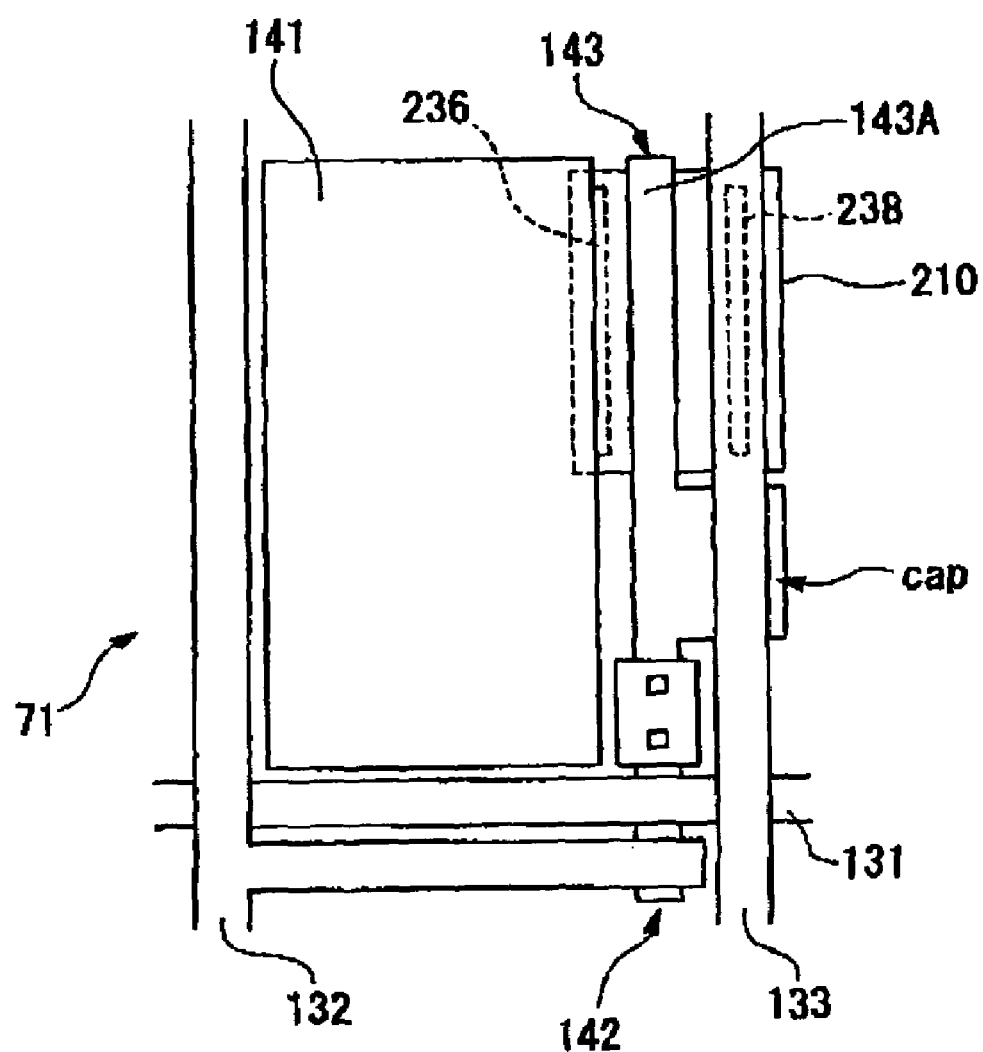
FIG. 5 is a diagram for explanation of a portion corresponding to one pixel of the organic EL device as an electro-optical device.

FIGS. 4 and 5 are diagrams illustrating a schematic configuration of an example of an exemplary organic EL device 70 as an electro-optical device. FIG. 4 is an exemplary circuit diagram, and FIG. 5 is an enlarged plan view illustrating a plan configuration of each pixel 71 and omitting a reflection electrode or organic EL element thereof.

As shown in FIG. 4, the organic EL element 70 can include, on a transparent substrate, a plurality of scanning lines (wiring lines, power connection parts) 131, a plurality of signal lines (wiring lines, power connection parts) 132 extending in the direction crossing the plurality of scanning lines 131, and a plurality of common feeders (wiring lines, power connection parts) 133 extending in the direction parallel to the signal lines 132, pixels (pixel areas) 71 are provided in intersections of the scanning lines 131 and the signal lines 132.

A data side driving circuit 72 including a shift register, a level shifter, a video line, and an analog switch is provided for the signal lines 132.

Meanwhile, for the scanning lines 131, a scanning side driving circuit 73 including a shift register and a level shifter, and the like. is provided. Also, for each pixel area 71, a switching thin film transistor (a switching element, a power connection part) 142 where a scanning signal (power) is supplied to a gate thereof through the scanning lines 131, a storage capacitor cap for holding an image signal (power) supplied through the switching thin film transistor 142 from the signal lines 132, a current thin film transistor (switching element, power connection part) 143 where an image signal held by the storage capacitor cap is supplied to a gate thereof, a pixel electrode 141 where a driving current (power) is supplied from the common feeders 133 when being connected electrically to the common feeders 133 through the current thin film transistor 143, and a light-emitting part 140 interposed between the pixel electrode 141 and the reflection electrode 154 are provided.

Based on such a configuration, when the switching thin film transistor 142 is in an ON state by driving the scanning lines 131, potential (power) of the signal line 132 is held by the storage capacitor cap, and thus whether the current thin film transistor 143 is in an ON or an OFF state depends on the state of the storage capacitor cap. Then, current flows from the common feeder 133 to pixel electrode 141 through the channel of the current thin film transistor 143 and current flows to the reflection electrode 154 through the light-emitting part 140 so that the light-emitting part 140 emits in accordance with the amount of current flowing therethrough.

Herein, as shown in FIG. 5, in a planar configuration of each pixel 71, four sides of rectangular pixel electrode 141 correspond to the signal line 132, the common feeder 133, the scanning line 131, and a scanning line for other pixel electrode (not shown), respectively.

Next, a method of manufacturing an organic EL element (functional element) corresponding to the above-described organic EL display 70 will be described with reference to FIGS. 6 to 9. Also, in FIGS. 6 to 9, only a single pixel 71 is shown for ease of explanation.

First, a substrate P is provided. Herein, for the organic EL element, both a configuration (what is called, bottom emission) that light emitted from the light-emitting layer which will be described below is derived from the substrate side and a configuration (what is called, top emission) that light is derived from the counter side of the substrate can be applied. In the configuration that light is derived from the substrate side, transparent or translucent material such as glass, quartz, resin, etc. is used for a material of the substrate, but a glass is preferable for its low cost.

Also, it is desirable that a color transforming film including a color filter film or a fluorescent material, or a dielectric reflection film is provided to control the emitted light color.

In the configuration that light is derived from the counter side of the substrate, an opaque substrate can be used, and in this case, a thing that an insulation process, such as a surface oxidation, is applied to ceramics such as alumina, a metal sheet, such as stainless, a thermosetting resin, and a thermoplastic resin, etc. can be used.

In the present embodiment, a transparent substrate P made of a glass as a substrate is used. Then, on the contrary, if necessary, a base protecting film (not shown) including a silicon oxide film having the thickness of about 200 to 500 nm is formed by using a plasma CVD method using TEOS (tetraethoxysylane) or an oxygen gas as materials.

Figure 6A:
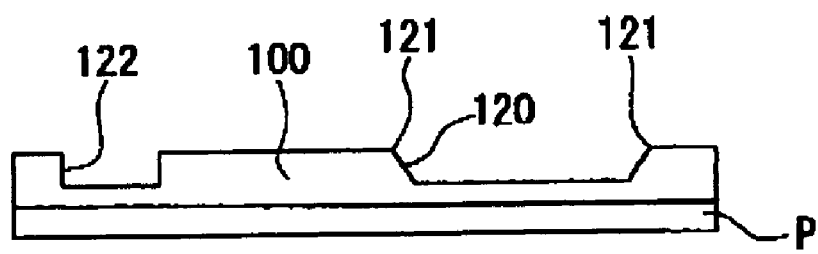
FIGS. 6A, 6B and 6C are diagrams for explanation of an embodiment of a method of manufacturing the organic EL device as an electro-optical device.

As shown in FIG. 6(a), an insulating layer (a desired material layer) 100 is formed on the substrate P. The insulating layer 100 is made of a silicon oxide film or silicon nitride film and formed on the substrate P by using a spin coating method and so on. Then, a portion of the insulating layer 100 is exposed to exposure light by using a photolithography, and then, a concave part 120 is formed in the insulating layer 100 by etching process. Also, the insulating layer 100 may be preferably formed by melting a resist, such as an acryl resin, a polyimide resin, and the like. in a solvent and then coating the melted register using a spin coating or a deep coating. Then, anything being capable of being patterned using an etching is preferably used as a formation material of the insulating layer.

Herein, the concave part 120 is formed in a tapered shape that is narrower toward the substrate P, and namely, that is broader toward the upper side in the figure. As a result, an edge portion 121 of the concave part 120 is formed at an obtuse angle. Also, the shape of the concave part 120 may not be the tapered shape, but also, the edge portion 121 may be formed at a right angle.

In addition, it may be desirable to form a lyophilic area and a lyophobic area on the surface of the insulating layer 100 including the concave part 120. A lyophilic process of forming a lyophilic area and a lyophobic process of forming a lyophobic area are performed by, for example, a plasma process. The plasma process can include a preliminary heating process, a lyophilic process of making a portion of a surface lyophilic, a lyophobic process of making a portion of a surface lyophobic, and a cooling process. Specifically, the substrate P is heated at a predetermined temperature (e.g., about 70 to 80° C.), and then as a lyophilic process, a plasma process $O_2$ plasma process) using an oxygen gas as a reaction gas is performed in the atmospheric atmosphere. Continuously, a plasma process ($CF_4$ plasma process) using a four fluoride methane gas as a reaction gas is performed in the atmospheric atmosphere, and the heated base is cooled to the room temperature to perform the plasma process thereby enabling portions to be lyophilic and lyophobic.

Also, a second concave part 122 is formed in a different position from that of the concave part 120.

Figure 6B:
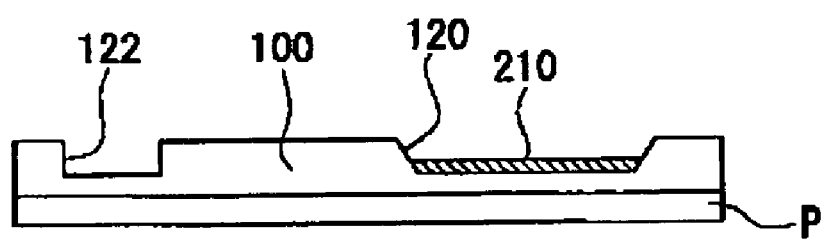

Next, as shown in FIG. 6(b), the temperature of a transparent substrate P is set to about 350° C., and a semiconductor film 210 made of an amorphous silicon film having thickness of about 30 to 70 nm is formed over the surface of a base protecting film in the concave part 120 by using the plasma CVD method. Next, a crystallization processing such as a laser annealing or a solid-state growing method is performed to the semiconductor film 210, as a result the semiconductor film 210 crystallizes to a polysilicon film. In laser annealing method, an excimer laser uses a line beam having a length of 400 mm, and the output intensity thereof is, for example, 200 mJ/cm$^2$. For the line beam, the line beam is scanned so as to overlap a portion corresponding to 90% of a peak value of laser intensity with each portion in the transverse direction. Herein, the semiconductor film 210, which will become a thin film transistor 143 in next process, is formed in the concave part 120 so that the semiconductor film 210 (thin film transistor 143) is almost continuous with a top face of the insulating layer 100.

Figure 6C:
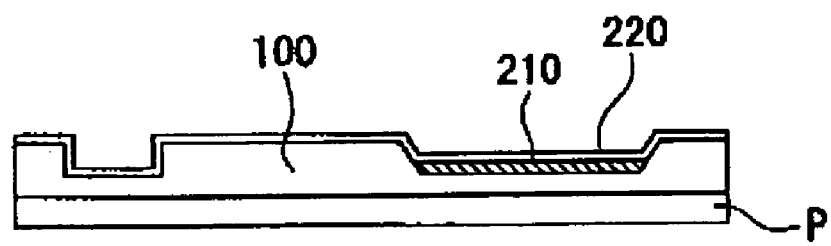

Then, as shown in FIG. 6(c), a gate insulating film 220 made of a silicon oxide film or a silicon nitride film having a thickness of 60 to 150 nm is formed over surfaces of the semiconductor film 210 and the insulating layer 100 by plasma CVD using a TEOS or an oxygen gas as materials. Also, the semiconductor film 210 becomes channel region and source/drain regions of the current thin film transistor 143 of FIG. 5, but in the other cutaway position, a semiconductor film becoming channel region and source/drain regions of the switching thin film transistor 142 is formed. Namely, in manufacturing process shown in FIGS. 6 to 9, two kinds of transistors are formed simultaneously in the same order. Thus, in below, only the current thin film transistor 143 will be explained relating to a transistor, an explanation for the switching thin film transistor 142 will be omitted.

Figure 7A:
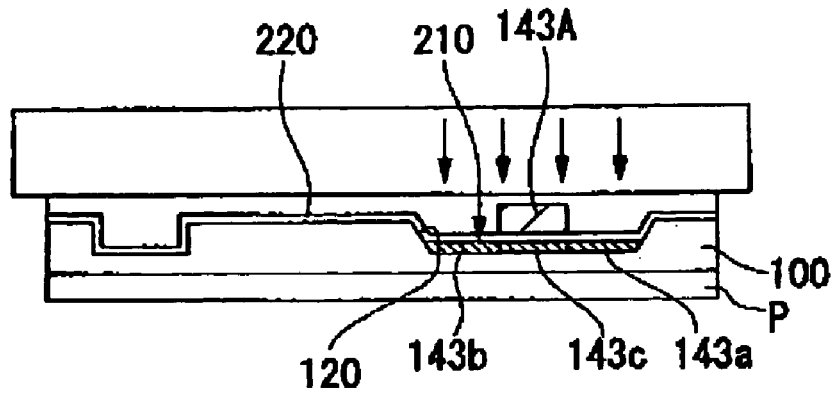
FIGS. 7A, 7B and 7C are diagrams for explanation of an embodiment of a method of manufacturing the organic EL device as an electro-optical device.

Next, as shown in FIG. 7(a), a conductive film made of a metal film, such as aluminum, tantalum, molybdenum, titan, tungsten, and the like. is formed in the concave part 120 by using a sputtering method, and then is patterned to be a gate electrode 143A. Then, in this state, high concentration phosphorus ion is injected, and source/drain regions 143a, 143b are formed in the semiconductor film 210 in self-aligned method for the gate electrode 143A. Also, region not being injected with impurity becomes a channel region 143c.

Figure 7B:
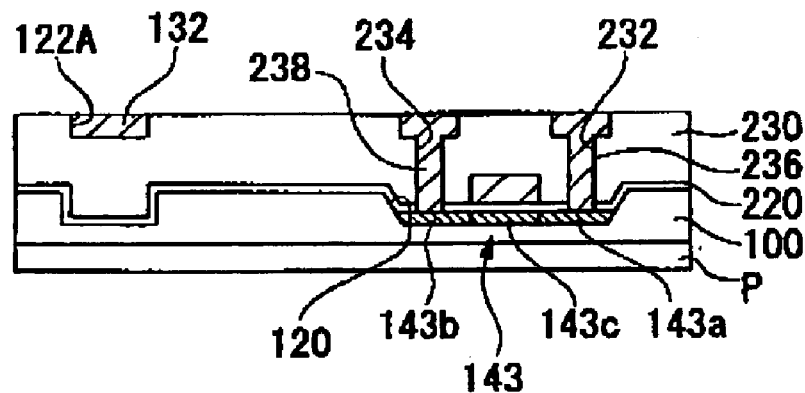

Next, as shown in FIG. 7(b), an interlayer insulating layer 230 is formed, contact holes 232 and 234 are formed, and drain electrode 236 and source electrode 238 are buried in the contact holes 232 and 234, respectively. Herein, top faces of the interlayer insulating layer 230 and the insulating layer 100 are formed almost continuous (are flush with each other). Moreover, a concave part 122A is formed in a position corresponding to a second concave part 122 of the interlayer insulating layer 230 by forming the second concave part 122. And, signal lines (wiring lines) 132 are formed in the concave 122A. At this time, a top face of the interlayer insulating layer 230 in which the concave part 122A is formed and a top face of the signal lines formed in the concave part 122A are almost continuous. Herein, when forming the second concave part 122 in FIG. 6(a), in order to make the top face of the interlayer insulating layer 230 be continuous with the top face of the signal lines 132, the depth of the second concave part 122 is set in advance, and then the second concave part 122 is formed.

Further, common feeders (wiring lines) (not shown) are formed on the interlayer insulating layer 230 of the concave 120 to be connected to the source electrode 238. In this regard, in the thin film transistor 143 formed in the concave part 120, top faces of the drain electrode 236 and the source electrode 238 are formed almost continuous with the top face of the interlayer insulating layer 230. Further, when forming the concave part 120, in order to make the top faces of the drain electrode 236 and the source electrode 238 almost continuous with the top face of the interlayer insulating layer 230, the depth of the concave part 120 or the interlayer insulating layer 230 is set in advance. Also, not shown in FIG. 7, scanning lines are formed on the insulating layer.

In other words, the top face of the interlayer insulating layer 230 is formed almost continuous with the top faces of the drain electrode 236 and the source electrode 238 of the thin film transistor 143 (the top face of the interlayer insulating layer 230 is flush with the top faces of the drain electrode 236 and the source electrode 238 of the thin film transistor 143).

Figure 7C:
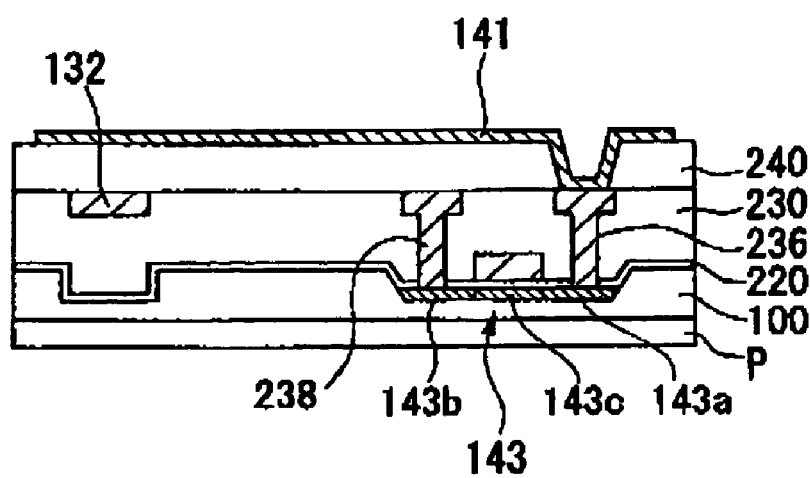

Then, as shown in FIG. 7(c), an interlayer insulating layer 240 applies the interlayer insulating layer 230 and the top face of each wiring line, a contact hole is formed in a position corresponding to the drain electrode 236, and an ITO film is formed to be buried in the contact hole. Further, the ITO film is patterned, a pixel electrode 141 is formed to be connected electrically to the source/drain region 143a in a position surrounded by a signal line, a common feeder, and a scanning line (not shown). The pixel electrode 141 constructs a part of an organic EL element. Herein, a portion interposed among the signal line, the common feeder, and the scanning line (not shown) becomes a hole-injecting layer or light-emitting layer of the organic EL element, which will be described below.

Further, since the top face of the interlayer insulating layer 230 and the top face of the thin film transistor 143 or the signal line 132 are so almost flat as to be flush with each other, the pixel electrode 141 formed above the thin film transistor 143 is flattened.

In the above-described process, for example, the insulating layer 100, the gate insulating film 220, or the interlayer insulating layer 230 may also be formed by using the liquid droplet ejecting device IJ. When liquid droplets including formation materials of the gate insulating film 220 or the interlayer insulating film 230 are ejected onto the substrate P by the liquid droplet ejecting head 20 of the liquid droplet ejecting device IJ, the ejected liquid droplet has high fluidity so as to be diffused in the horizontal direction. Since the concave part 120 is formed surrounding the applied region, the liquid droplet ejected from the liquid droplet ejecting head 20 is prevented from diffusing into the outside over the concave part 120 so that the liquid droplet can smoothly flow in the concave part 120. Herein, since the concave part 120 has the tapered shape being narrower toward the substrate P, the ejected liquid droplets are smoothly provided on the bottom part along the inner wall of the concave part 120.

Further, the liquid droplet ejecting device IJ can also be used when forming the signal lines 132. When forming the signal lines 132 as a wiring pattern, since liquid droplets including a material for forming the signal line ejected from the liquid droplet ejecting head 20 flow into the concave part 122A, a wiring pattern can be formed with desired pattern accuracy.

Figure 8A:
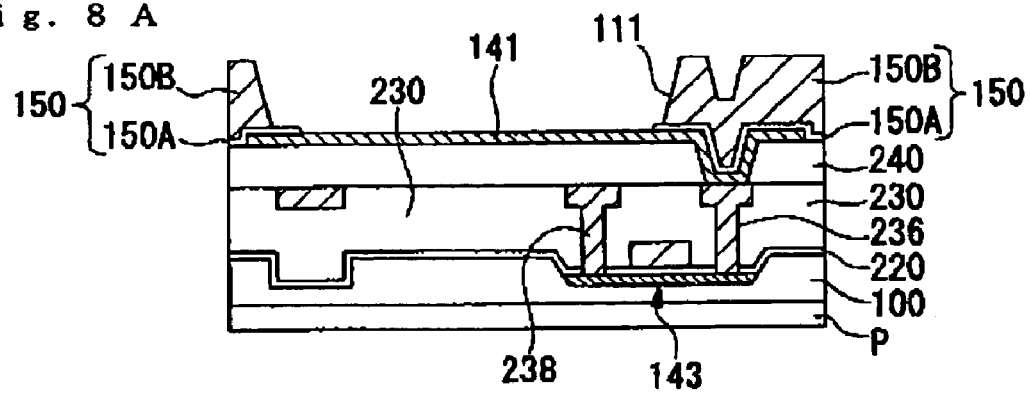
FIGS. 8A, 8B and 8C are diagrams for explanation of an embodiment of a method of manufacturing the organic EL device as an electro-optical device.

Next, as shown in FIG. 8(a), a first partition (inorganic bank) 150A and a second partition (organic bank) 150B are formed to surround the above-described formation region. These partitions 150A and 150B function as a partition member. For example, the first partition 150A is made of dioxide silicon. The second partition 150B is made of an insulating organic material such as a polyimide. The film thickness of the second partition 150B is set to, for example, about 1 to 2 μm. It is also desirable that the partitions 150A and 150B have no affinity for the liquid material ejected from the liquid droplet ejecting head 20. To develop the non-affinity for the partitions, for example, a method of processing a surface of the partitions with a fluoride compound is used. For example, $CF_4$, $SF_5$, $CHF_3$, etc. are used as a fluoride compound, and a plasma process and an UV exposure are used as a surface processing method.

And then, based on this structure, a step 111 with a sufficient height can be formed between formation regions of hole-injecting layer or light-emitting layer of an organic EL element, that is, application regions of these formation materials and the partitions 150B (150A) surrounding them.

Figure 8B:
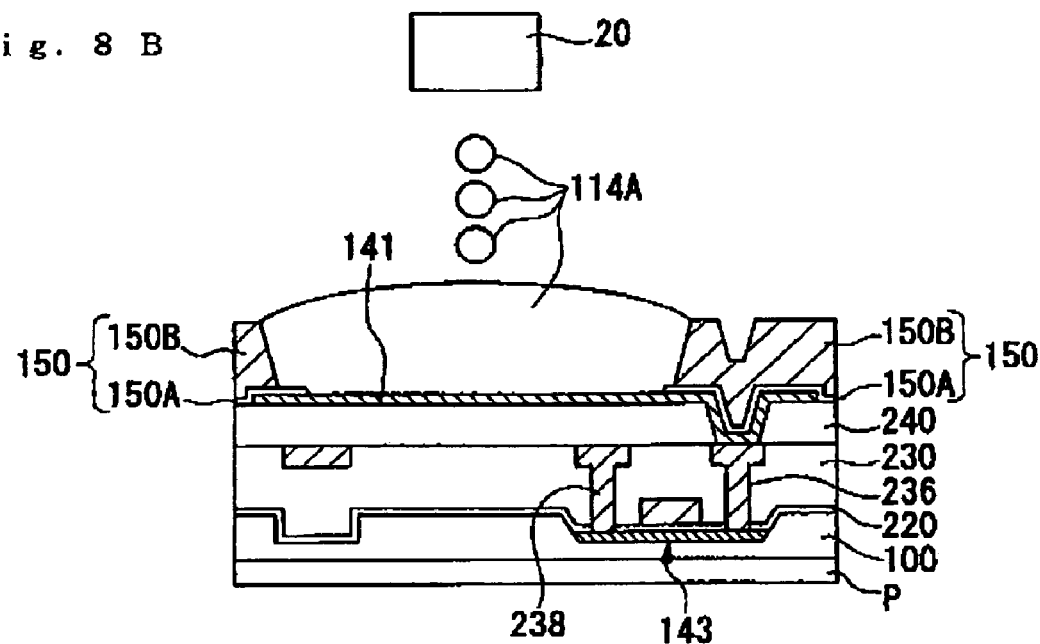

Next, as shown in FIG. 8(b), in the state of the top face of the substrate P being upward, a liquid material 114A including a material for forming the hole-injecting layer is selectively applied to the application region surrounded by the partitions 150 (150A, 150B), that is, in the partitions 150 by using the liquid droplet ejecting head 20. The liquid material 114A for forming the hole-injecting layer, which is produced by the liquid material regulating device S, includes a material for forming the hole-injecting layer and a solvent.

As a material for forming the hole-injecting layer, polyphenylenevinylene where a polymer precursor is a polytetrahydrothiophenylphenylene, 1,1-bis-(4-N,N-ditolylaminophenyl)cyclohexane, tris(8-hydroxyquinolinol) aluminum, baytron P, polystyrene sulfonate, and the like can be used.

Also, a polar solvent such as isopropyl alcohol, N-methylpyrrolidone, 1,3-dimethylimidazolinone can be used as a solvent.

When the liquid material 114A including the above-described material for forming the hole-injecting layer and the solvent is ejected onto the substrate P by the liquid droplet ejecting head 20, the ejected liquid material has high fluidity so as to be diffused in the horizontal direction. But, since the partitions 150 are formed surrounding the applied region, the liquid material 114A is prevented from diffusing into the outside over the partitions 150.

Figure 8C:
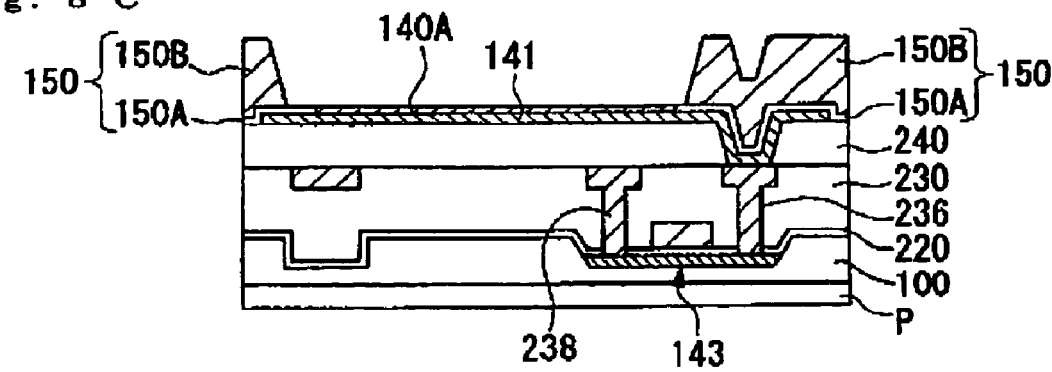

Next, as shown in FIG. 8(c), solid hole-injecting layer 140A is formed on the pixel electrode 141 by evaporating a solvent of the liquid material 114A by using heating or light exposure. Also, it is desirable to bake it in the condition of a desired temperature and time (e.g., 200° C., 10 minutes) under atmospheric atmosphere or nitrogen gas atmosphere. Further, it is desirable to remove the solvent by arranging the liquid material at the atmosphere below the atmospheric pressure.

Figure 9A:
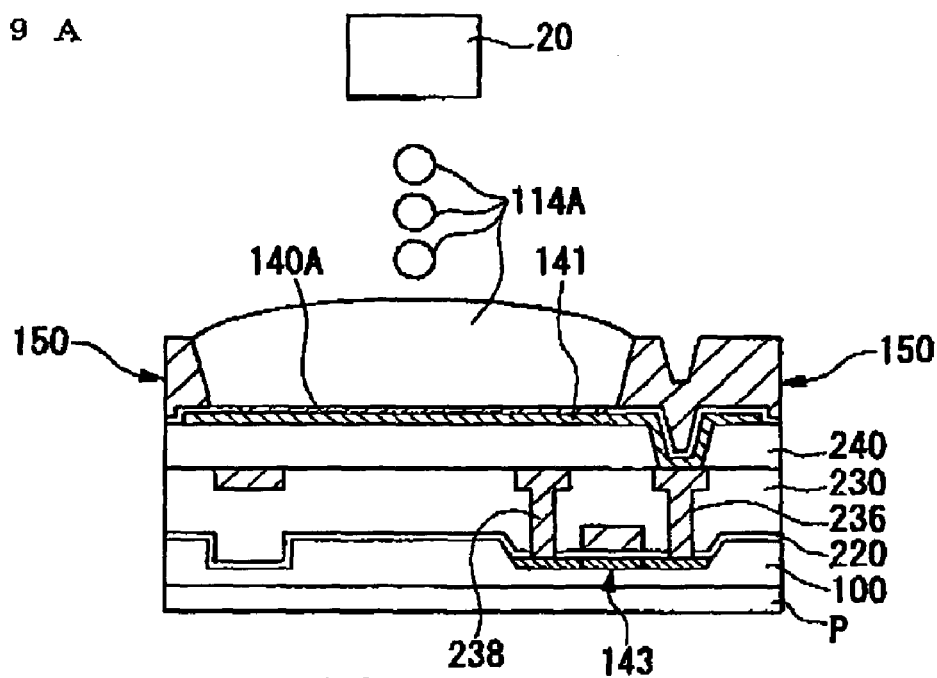
FIGS. 9A, 9B and 9C are diagrams for explanation of an embodiment of a method of manufacturing the organic EL device as an electro-optical device.

Next, as shown in FIG. 9(a), a liquid material 114B, including a material for forming the light-emitting layer and a solvent, is selectively applied on the hole-injecting layer 140A in the partitions 150 by using the liquid droplet ejecting head 20.

As a material for forming the light-emitting layer, it is greatly desirable to use the material including a precursor of conjugated high polymer organic compound and a fluorescent dye for changing luminescence characteristic of the light-emitting layer.

The precursor of conjugated high polymer organic compound is ejected together with the fluorescent dye by the liquid droplet ejecting head 20 to be a thin film, and then, as exemplarily shown in chemical equation (I) below, is heated and hardened to be a light-emitting layer of conjugated high polymer organic EL layer. For example, sulfonium salt of the precusor is heated to remove the sulfonium radical and then becomes conjugated high polymer organic compound.

[Chemical Equation I]

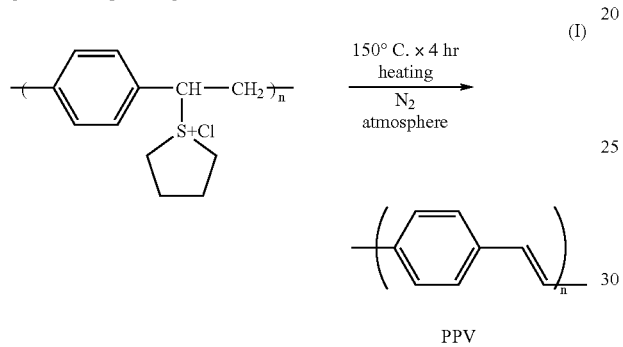

It is possible for the conjugated high polymer organic compound to be formed a solid ultra-thin film having intensive fluorescence and uniform quality. Moreover, the conjugated high polymer organic compound has an excellent forming ability and a high affinity for ITO electrode.

Furthermore, after the precursor of such a compound is hardened, solid conjugated high polymer can be formed. But before hardening, since it is possible to adjust a viscosity of the precursor to a desired viscosity applicable for liquid droplet ejecting patterning to be described later, a film formation of an optimal condition can be performed simply and speedily.

For such a precursor, it is desirable to use a precursor of PPV (poly(paraphenylenevinylene)) or a precursor of PPV derivative. Since the precursor of PPV or PPV derivative can be melted down in water or organic solvent and be polymerized, an optically high quality thin film can be obtained. Besides, since PPV has intensive fluorescence and is conductive high polymer where π electron in double bond is non-polarized in polymer loop, highly efficient organic EL element can be obtained.

For such a precursor of PPV or PPV derivative, as exemplarily shown in chemical equation (II), precursor of PPV (poly(paraphenylenevinylene)), precursor of MO-PPV (poly(2,5-dimethoxY-1,4-phenylenevinylene)), precursor of CN-PPV (poly(2,5-bishexyloxY-1,4-phenylene-(1-cyanovinylene))), precursor of MEH-PPV (poly[2-methoxY-5-(2'-ethylhexyloxy)]-paraphenylenevinylene) can be used.

[Chemical Equation II]

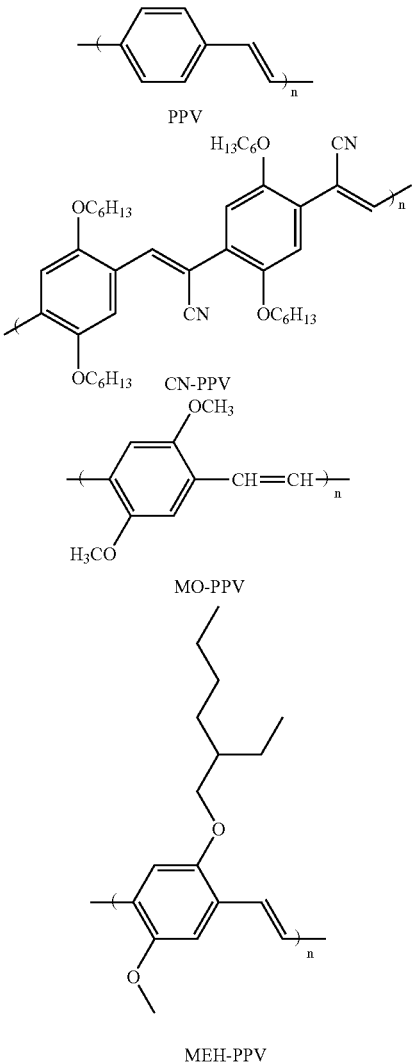

As described above, the precursor of PPV or PPV derivative can be melted in water, and after forming film, the film is heated to be a PPV layer of high polymer. It is desirable that a content of representative precursor of the above-described precursor of PPV is 0.01 to 10.0 weight percent for the whole composition, and more desirable for 0.1 to 5.0 weight percent. If an additive of precursor is so small, it is not sufficient to form the conjugated high polymer film, but if an additive of precursor is so much, because viscosity of composition increases, it is unsuitable for high accurate patterning using inkjet method.

In addition, it is desired that a material for forming the light-emitting layer includes at least one kind of fluorescent dyes. Thereby, since luminescence characteristic of the light-emitting layer can be varied, for example, it is useful for improving luminous efficiency of the light-emitting layer and varying light absorption maximal wave (the emitted light color). That is, the fluorescent dye is not a material for only the light-emitting layer, but a dye material taking charge of luminescent function in itself. For example, it is possible to transfer most energy of exciton produced from carrier recombination of conjugated high polymer organic compound molecule into a fluorescent dye molecule. In this case, since luminescence is generated from only a fluorescent dye molecule having high fluorescent quantum efficiency, the current quantum efficiency of the light-emitting layer increases. Thus, by adding the fluorescent dye to the material for forming the light-emitting layer, simultaneously, luminescent spectrum of the light-emitting layer becomes that of fluorescent molecule, and thus it is useful to means for varying the fluorescent color.

Further, the current quantum efficiency is standard for considering luminous capability based on the luminous function, and defined by following equation.

$\eta E$=energy of emitted photon/input electric energy

Therefore, by varying light absorption maximal wave by dope of fluorescent dye, for example, three primary colors of red, blue, green can be emitted thereby enabling a full color display medium to be obtained.

Furthermore, by doping the fluorescent dye, luminous efficiency of an EL element can greatly be improved.

As the fluorescent dye, when forming the light-emitting layer emitting red light, it is preferable to use rhodamine or rhodamine derivative having red light. Since the above fluorescent dye is a low polymer, it is soluble in a water solution and is soluble in PPV, as a result it is easy to form a uniform and stable light-emitting layer. Specifically, rhodamine B, rhodamine B base, rhodamine 6 G, rhodamine 101 perchorate can be used as the fluorescent dye, and mixture of at least two kinds of them is preferable.

Further, when forming the light-emitting layer emitting green light, it is preferable to use quinacridone or a derivative thereof having green light. In the same manner as the above-described red fluorescent dye, since the green fluorescent dye is a low polymer, it is soluble in a water solution and is soluble in PPV, as a result it is easy to form a light-emitting layer.

In addition, when forming the light-emitting layer emitting blue light, it is preferable to use distyrylbiphenyl or a derivative thereof having blue light. In the same manner as the above-described red fluorescent dye, since the blue fluorescent dye is a low polymer, it is soluble in a water solution and is soluble in PPV, as a result, it is easy to form a light-emitting layer.

Coumarin, and a derivative thereof, may be used as other fluorescent dyes having blue light. These fluorescent dyes are low polymers like the red fluorescent dyes thereby to be soluble in a water solution. Also, the fluorescent dyes are soluble in PPV thereby to easily form a light-emitting layer. To be specific, coumarin, coumarin-1, coumarin-6, coumarin-7, coumarin 120, coumarin 138, coumarin 152, coumarin 153, coumarin 311, coumarin 314, coumarin 334, coumarin 337, and coumarin 343 are used as the fluorescent dyes.

Furthermore, tetraphenylbutadiene (TPB) or a TPB derivative can be used as the fluorescent dyes having another blue light. Since the above fluorescent dyes are low polymers like the red fluorescent dyes thereby to be soluble in the water solution. Also, the fluorescent dyes are soluble in PPV thereby to easily form the light-emitting layer.

Only one kind of the above fluorescent dyes may be used for each color. Also, a mixture of two or more fluorescent dyes may be used for each color.

It is preferable to add the 0.5 to 10 weight percent of fluorescent dye to a precursor solid matter of the conjugated high polymer organic compound. It is more preferable to add the 1.0 to 5.0 weight percent of fluorescent dye to the precursor solid matter. If the fluorescent dye is added excessively, it is difficult to maintain the weatherproofness and the durability of the fluorescent layer. If the fluorescent dye is added too little, an effect caused by adding the fluorescent dyes cannot be obtained sufficiently.

It is preferable that the above precursor and the fluorescent dye be a liquid material which is dissolved or dispersed in a polar solvent to eject the liquid material from a liquid drop ejecting head 20. Since the polar solvent can easily dissolve or uniformly disperse the precursor and the fluorescent dyes, it is possible to prevent a solid matter among materials of forming the light-emitting layer from being attached to the nozzle hole of the liquid drop ejecting head 20 or a net from being stopped up.

To be specific, water, alcohol having solubility in water, such as methanol or ethanol, and organic solvents or inorganic solvents, such as N,N-dimethylformamide (DMF), N-methylpyrrolidone (NMP), dimethylimidazoline (DMI), dimethylsulfoxide (DMSO), xylene, cyclonexylbenzene, and 2,3-dihydrobenzofuran, are used as the polar solvents. An appropriate mixture of two or more solvents may be used as the polar solvent.

Furthermore, it is preferable to add humectants to the materials for forming the light-emitting layer. Therefore, it is possible to prevent the materials from being dried and solidified in the nozzle hole of the liquid drop ejecting head 20. For example, polyhydric alcohol, such as glycerine and diethyleneglycol, may be used as the humectants. A mixture of two or more kinds of the polyhydric alcohols may be used as the humectants. The amount of the humectants added to the material is preferably about 5 to 20 weight percent with respect to the total amount of the material.

An addition agent and a film stabilizing material may be added thereto. For example, a stabilizing agent, a viscosity controlling agent, an antioxidant, a pH controlling agent, an antiseptic, a resin emulsion, and a leveling agent can be used.

When a liquid material 114B including such a material for forming the light-emitting layer is ejected from the liquid drop ejecting head 20, a hole-injecting layer 140A in a partition 150 is coated with the liquid material 114B.

The light-emitting layer is formed by ejecting the liquid material 114B including the light-emitting layer forming material for emitting red color developing light, a light-emitting layer forming material for emitting green color developing light, and a light-emitting layer forming material for emitting blue light into respective corresponding pixels 71 thereby to coat the pixels 71 with the liquid material 114B. Also, the pixels 71 corresponding to the respective colors are previously determined so that they are regularly arranged.

Figure 9B:
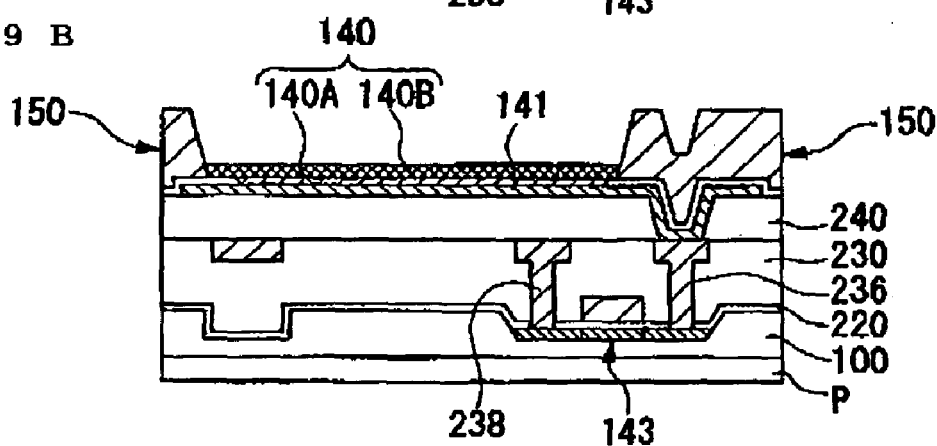

As mentioned above, when the liquid material 114B including the respective colors of light-emitting layer forming materials are ejected into the pixels 71 and the pixels 71 are coated with the liquid material 114B, a solvent in the liquid material 114B is evaporated. Therefore, as illustrated in FIG. 9(*b*), a solid light-emitting layer 140B is formed on the hole-injecting layer 140A. As a result, it is possible to obtain a light-emitting portion 140 consisting of the hole-injecting layer 140A and the light-emitting layer 140B. The solvent in the liquid material 114B including the light-emitting layer forming material is evaporated by heating the solvent or reducing the pressure of the solvent, if necessary. It is not necessary to heat the solvent or reduce the pressure of the solvent because the light-emitting layer forming material is easily and fast dried. Therefore, it is possible to sequentially discharge the respective colors of light-emitting layer forming materials into the pixels 71 thereby to form the respective colors of light-emitting layers 140B in the order of coating the pixels with the respective colors of light-emitting layer forming materials.

Figure 9C:
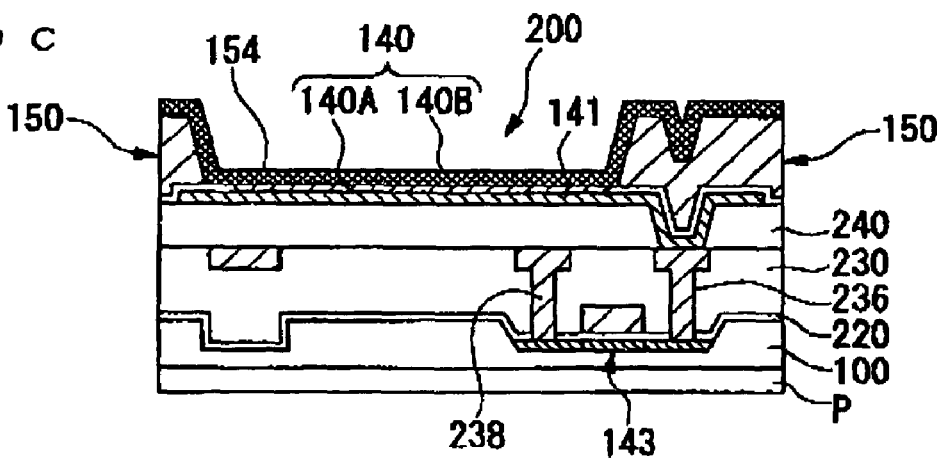

As illustrated in FIG. 9(c), a reflective electrode 154 is formed on the entire surface of a transparent substrate P or in stripes. As a result, the organic EL element 200 is manufactured. According to the present embodiment, the organic EL element 200 includes a pixel electrode 141, the hole-injecting layer 140A, the light-emitting layer 140B, and the reflective electrode 154.

According to such a method of manufacturing the organic EL element, a thin film formed of the components of the organic EL element, that is, the hole-injecting layer 140A and the light-emitting layer 140B is manufactured by a liquid droplet ejecting device IJ. Therefore, the loss of a liquid material that is a material of forming the hole-injecting layer 140A and the light-emitting layer 140B is reduced. Furthermore, the hole-injecting layer 140A and the light-emitting layer 140B are stably formed at a relatively low price.

As illustrated in FIG. 9(c), a part of a formed thin film transistor 143 and a part of an organic EL element 200 overlap with each other in the normal line direction of the surface of the substrate P. When a top emission structure where light from the light-emitting layer is derived from the opposite side of the substrate P is adopted, it does not matter even if the TFT 143 and the organic EL element overlap with each other. That is, the TFT and the organic EL element may overlap with each other. Therefore, the degree of freedom of a design increases. According to a bottom emission structure, it is necessary that the TFT and the organic EL element do not overlap each other by arranging the TFT below the partition 150. However, according to the top emission structure, it is not necessary to arrange the TFT below the partition 150. Also, it is possible to reduce the size of a region where the partition 150 is formed and to increase the size of a region where the organic EL element is formed. As a result, it is possible to increase the size of the light-emitting area.

As mentioned above, it is possible to flatten the top face of the TFT 143 and the top face of an insulating layer 100 by forming a concave part 120 in the insulating layer 100 formed on the substrate P and arranging the TFT 143 in the concave part 120. Therefore, it is possible to make the organic EL element 200 concavo-convex even if the organic EL element is formed on the TFT 143. As a result, it is possible to prevent the deterioration of display quality.

According to the above embodiment, after forming the insulating layer 100 on the substrate P, the concave part 120 is formed by a photolithography method and the TFT 143 is formed in the concave part 120. However, it is possible to arrange the insulating layer around the TFT 143 to be flush with the top face of the TFT 143 after forming the TFT 143 on the substrate P or on a predetermined material layer (a supporting layer) formed on the substrate P. It is effective to use a liquid droplet ejecting method capable of easily arranging the liquid materials in an arbitrary place in arranging the insulating layer.

According to the above-described embodiment, a film is formed of the liquid materials by the liquid droplet ejecting method using the liquid droplet ejecting device IJ. However, the present invention is not limited to the liquid droplet ejecting method. For example, other coating method such as a spin coating method may be used.

Processes of producing the liquid materials and of forming the film may be performed in the atmospheric atmosphere and in an inactive gas atmosphere, such as a nitrogen gas. Processes of forming the liquid material by a liquid material regulating apparatus S and of forming the film by the liquid droplet ejecting device IJ are preferably performed in a clean room in atmospheres where a degree of cleanness is chemically maintained with few particles.

According to the above embodiment, the manufacturing method of the present invention can be applied to a case of manufacturing the organic EL apparatus. However, the manufacturing method may also be applied to a case of manufacturing other electro-optical devices, such as liquid crystal devices. That is, the manufacturing method according to the present invention can be applied to a case of manufacturing an apparatus having a structure where a TFT as a switching element is formed on a substrate.

The organic EL device (the electro-optical device) according to the present invention is applied to various electronic apparatuses with display portions. Examples of applying the electronic apparatuses with the electro-optical devices according to the present invention will now be described.

Figure 10:
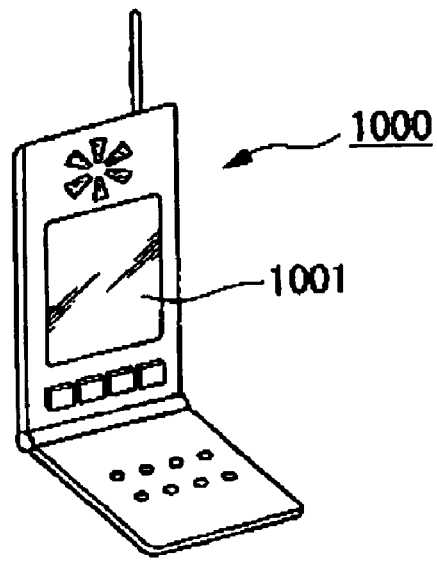
FIG. 10 is a diagram showing an electronic apparatus equipped with an electro-optical device of the present invention.

FIG. 10 is a perspective view illustrating an example of a mobile telephone. In FIG. 10, reference numeral 1000 denotes the main body of a mobile telephone and reference numeral 1001 denotes a display portion using the organic EL displaying apparatus.

Figure 11:
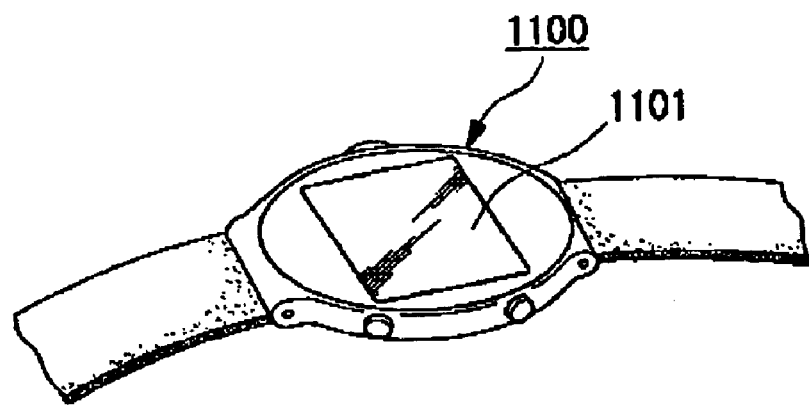
FIG. 11 is a diagram showing an electronic apparatus equipped with an electro-optical device of the present invention.

FIG. 11 is a perspective view illustrating an example of a watch type electronic apparatus. In FIG. 11, reference numeral 1100 denotes the main body of a watch and reference numeral 1101 denotes a display portion using the organic EL displaying apparatus.

Figure 12:
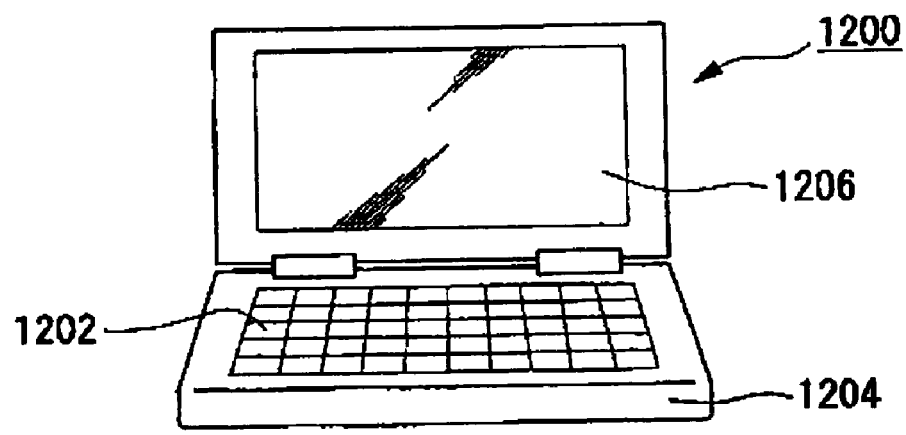
FIG. 12 is a diagram showing an electronic apparatus equipped with an electro-optical device of the present invention.

FIG. 12 is a perspective view illustrating an example of a potable information processing apparatus, such as a word processor and a personal computer. In FIG. 12, reference numeral 1200 denotes an information processing apparatus, reference numeral 1202 denotes an input portion such as a keyboard, reference numeral 1204 denotes the main body of an information processing apparatus, and reference numeral 1206 denotes a display portion using the organic EL displaying apparatus.

The electronic apparatuses illustrated in FIGS. 10 to 12 include the organic EL displaying apparatus according to the above embodiment thereby to have excellent display quality. Therefore, it is possible to realize an electronic apparatus having an organic EL display portion with a bright screen.

Further to the above-mentioned examples, a liquid crystal TV, a view finder type or monitor direct view type video tape recorder, a car navigation apparatus, a pager, an electronic organizer, a electronic calculator, a word processor, a work station, a picture telephone, a POS terminal, an electronic paper, and an apparatus with a touch panel may be taken as other examples. The electro-optical device according to the present invention can be used as the display portion of such electronic apparatuses.

As described above, it is possible to flatten the top face of a conductive portion and the top face of a material layer by forming a concave part in the material layer formed on a substrate and arranging a conductive portion in the concave part. Therefore, even if a functional element is formed on the conductive portion, the functional element can be made concavo-convex. As a result, it is possible to prevent the deterioration of a performance.

What is claimed is:

1. An organic electroluminescent (EL) device having plurality of scanning lines, a plurality of signal lines extending in the direction crossing the plurality of scanning lines, a plurality of common feeders, and pixels that are provided in intersections of the scanning lines and the signal lines, each pixel having a switching thin film transistor, a current thin film transistor where an image signal is supplied to a gate from the signal line, a first electrode where a driving current is supplied from the common feeders when being connected electrically to the common feeders through the current thin film transistor, and a light-emitting part interposed between the first electrode and the second electrode are provided, comprising:

a concave part formed in a material layer provided on a substrate; and a power connection part formed in the concave part, the power connection part comprising the plurality of scanning lines, the plurality of signal lines, the plurality of common feeders, the switching thin film transistors, and the current thin film transistors, the first electrode and the light-emitting part formed above at least part of the power connection part.

2. The organic electroluminescent (EL) device according to claim 1, the concave part being formed in an insulating layer provided on the substrate.

3. The organic electroluminescent (EL) device according to claim 1, the concave part being formed in a tapered shape being narrower toward the substrate.

4. The organic electroluminescent (EL) device according to claim 1, a top face of the material layer in which the concave part is formed being substantially continuous with top faces of the power connection part disposed in the concave part.

5. The organic electroluminescent (EL) device according to claim 1, at least a portion of each of the light emitting parts being overlapped with each of power connection parts.

6. The organic electroluminescent (EL) device according to claim 1, the light emitting parts being organic electroluminescent elements.

7. An electronic apparatus equipped with the organic electroluminescent (EL) device according to claim 1.

8. An organic electroluminescent (EL) device having plurality of light emitting parts, comprising:

a concave part formed in a material layer provided on the substrate;

common feeders formed in the concave part, the common feeders supplying power to each of the plurality of light emitting parts;

a first electrode formed above at least part of the common feeders;

a light emitting layer formed above the first electrode; and a second electrode formed above the light emitting layer.

* * * * *